(12) United States Patent
Song et al.

(10) Patent No.: US 12,386,267 B2
(45) Date of Patent: Aug. 12, 2025

(54) LEARNING CONTROL SYSTEM AND METHOD FOR ULTRA-PRECISION LITHOGRAPHIC APPARATUS BASED ON UNCERTAINTY COMPENSATION

(71) Applicant: Harbin Institute of Technology, Harbin (CN)

(72) Inventors: Fazhi Song, Harbin (CN); Pengyu Sun, Harbin (CN); Aichen Wu, Harbin (CN); Yang Liu, Harbin (CN); Jiubin Tan, Harbin (CN)

(73) Assignee: Harbin Institute of Technology, Harbin (CN)

( * ) Notice: Subject to any disclaimer, the term of this patent is extended or adjusted under 35 U.S.C. 154(b) by 0 days.

(21) Appl. No.: 19/063,189

(22) Filed: Feb. 25, 2025

(65) Prior Publication Data

US 2025/0199417 A1 Jun. 19, 2025

(30) Foreign Application Priority Data

Feb. 26, 2024 (CN) .......................... 202410208941.8

(51) Int. Cl.
*G05B 13/02* (2006.01)
*G03F 7/00* (2006.01)

(52) U.S. Cl.
CPC .......... *G03F 7/705* (2013.01); *G03F 7/70358* (2013.01); *G03F 7/70508* (2013.01); *G03F 7/70525* (2013.01); *G05B 13/0265* (2013.01)

(58) Field of Classification Search
CPC ................ G03F 7/705; G03F 7/70358; G03F 7/70508; G03F 7/70525; G05B 13/0265
See application file for complete search history.

(56) References Cited

U.S. PATENT DOCUMENTS

2005/0043834 A1 2/2005 Rotariu et al.
2007/0250187 A1* 10/2007 Heertjes ............... G05B 19/416
700/44

(Continued)

FOREIGN PATENT DOCUMENTS

CN 101059658 A 10/2007
CN 117369271 A * 1/2024

*Primary Examiner* — Yuhui R Pan
(74) *Attorney, Agent, or Firm* — True Shepherd LLC; Andrew C. Cheng

(57) ABSTRACT

A learning control system includes a movement trajectory generation unit, a learning control unit, a feedback control unit, and an uncertainty compensation unit. The movement trajectory generation unit includes a movement trajectory generator; the movement trajectory generator is configured to generate a reference movement trajectory; a position measured signal is subtracted from the reference movement trajectory to obtain a position error signal which is input to the learning control unit; the learning control unit is configured to generate a feed-forward signal which is added with the position error signal to obtain a corrected error signal; and the corrected error signal is input to the feedback control unit; the feedback control unit includes a feedback controller configured to generate a feedback control quantity which is input to the uncertainty compensation unit; and the uncertainty compensation unit is configured to generate the position measured signal.

2 Claims, 5 Drawing Sheets

(56) References Cited

U.S. PATENT DOCUMENTS

2016/0170311 A1* 6/2016 Schmitt-Weaver ............................ G03F 7/70516
355/67
2018/0367067 A1 12/2018 Yang et al.
2023/0315027 A1* 10/2023 Van Berkel ............ G06N 3/084
700/48

* cited by examiner

LEARNING CONTROL SYSTEM AND METHOD FOR ULTRA-PRECISION LITHOGRAPHIC APPARATUS BASED ON UNCERTAINTY COMPENSATION

CROSS-REFERENCE TO RELATED APPLICATIONS

This application claims priority to Chinese Patent Application No. 202410208941.8 with a filing date of Feb. 26, 2024. The content of the aforementioned application, including any intervening amendments thereto, is incorporated herein by reference.

TECHNICAL FIELD

The present disclosure belongs to the technical field of ultra-precision apparatus manufacturing, relates to a system and method for controlling an ultra-precision lithographic apparatus, and particularly relates to a learning control system and method for an ultra-precision lithographic apparatus based on uncertainty compensation.

BACKGROUND

With the pursuit of Moore's Law, semiconductor manufacturers are imposing higher and higher requirements on the yield and quality of chips. This is manifested in the lithographic apparatus that must have high dynamics and high accuracy. The shorter transition time of the movement mechanism of the lithographic apparatus from an accelerating section to a uniform scanning exposure section indicates a larger number of chips exposed in unit time, and a higher yield. The smaller tracking error of the movement mechanism in the scanning exposure section means higher imaging quality and higher quality of the chips. Hence, researching advanced control methods, and improving control accuracy of the ultra-precision lithographic apparatus are of great significance to improve performance of the chips.

Due to repetitive nature of the scanning exposure process, an iterative learning control method is widely applied to movement control of the ultra-precision lithographic apparatus. However, the conventional learning control method has two problems: (1) The design of the learning gain is dependent on a mathematical model of the control object. The higher accuracy of the model means a higher rate of convergence and better convergence performance of the control method. However, for the complex ultra-precision lithographic apparatus, due to the flexible modality and complex dynamics, the accurate mathematical model is obtained hardly, and the modeling cost is high. (2) The non-repetitive disturbances are not suppressed, but are amplified possibly, by the iterative learning control method. The external random disturbances will reduce performance of the iterative learning control method. The above two factors restrict the actual application of the iterative learning control method in the ultra-precision lithographic apparatus.

SUMMARY OF PRESENT INVENTION

In order to solve the problem that the existing learning control method is strongly dependent on the model and sensitive to the non-repetitive disturbance, and thus is restricted in the ultra-precision lithographic apparatus, the present disclosure provides a learning control system and method for an ultra-precision lithographic apparatus based on uncertainty compensation. The present disclosure can effectively reduce the influence of the model uncertainty on learning performance, can effectively compensate the external random disturbance, and has a simple design and a strong practical application value.

The objective of the present disclosure is achieved by the following technical solutions:

A learning control system for an ultra-precision lithographic apparatus based on uncertainty compensation includes a movement trajectory generation unit $S_1$, a learning control unit $S_2$, a feedback control unit $S_3$, and an uncertainty compensation unit $S_4$; the movement trajectory generation unit $S_1$ includes a movement trajectory generator $C_r$; the movement trajectory generator $C_r$ is configured to generate a reference movement trajectory $y_d(t)$; a position measured signal $y_{\varepsilon,k}(t)$ is subtracted from the reference movement trajectory $y_d(t)$ to obtain a position error signal $e_k(t)$; and the position error signal $e_k(t)$ is input to the learning control unit $S_2$; the learning control unit $S_2$ includes a learning controller $C_L$ and an iterative backward shift operator $z^{-1}$; the position error signal $e_k(t)$ and a feed-forward signal $e_{ff,k}(t)$ are input to the learning controller $C_L$; the learning controller $C_L$ is configured to generate a (k+1)th feed-forward signal $e_{ff,k+1}(t)$; the (k+1)th feed-forward signal $e_{ff,k+1}(t)$ is input to the iterative backward shift operator $z^{-1}$; the iterative backward shift operator $z^{-1}$ is configured to generate the kth feed-forward signal $e_{ff,k}(t)$; the feed-forward signal $e_{ff,k}(t)$ and the position error signal $e_k(t)$ are added together to obtain a corrected error signal $e_{fb,k}(t)$; and the corrected error signal $e_{fb,k}(t)$ is input to the feedback control unit $S_3$; the feedback control unit $S_3$ includes a feedback controller $C_{fb}$; the feedback controller $C_{fb}$ is configured to generate a feedback control quantity $u_{fb,k}(t)$; and the feedback control quantity $u_{fb,k}(t)$ is input to the uncertainty compensation unit $S_4$; the uncertainty compensation unit $S_4$ includes a nominal mass module $\hat{M}$, a lithographic apparatus P, an extended state observer $C_{eso}$, an external disturbance signal $f_{d,k}(t)$, and a measured noise signal $\varepsilon_k(t)$; an uncertainty estimated signal $\hat{F}^{-1}_{d,k}(t)$ is subtracted from the feedback control quantity $u_{fb,k}(t)$ to obtain a compensated control quantity $u_{mi,k}(t)$; the compensated control quantity $u_{mi,k}(t)$ is input to the nominal mass module $\hat{M}$; the nominal mass module $\hat{M}$ is configured to generate a corrected control quantity $u_{mo,k}(t)$; the corrected control quantity $u_{mo,k}(t)$ and the external disturbance signal $f_{d,k}(t)$ are added together to obtain a total input signal $u_{P,k}(t)$; the total input signal $u_{P,k}(t)$ is input to the lithographic apparatus P; the lithographic apparatus P is configured to generate an actual position signal $y_{P,k}(t)$; the actual position signal $y_{P,k}(t)$ and the measured noise signal $\varepsilon_k(t)$ are added together to obtain the position measured signal $y_{\varepsilon,k}(t)$; the position measured signal $y_{\varepsilon,k}(t)$ and the corrected control quantity $u_{mo,k}(t)$ are input to the extended state observer $C_{eso}$; and the extended state observer $C_{eso}$ is configured to generate the uncertainty estimated signal $\hat{F}^{-1}_{d,k}(t)$; and the subscript k represents a number of iterative experiments, $k \geq 1$, and t represents time.

A learning control method for an ultra-precision lithographic apparatus based on uncertainty compensation with the system includes the following steps:

step 1, performing Fourier transform on the kth position error signal $e_k(t)$ and the kth feed-forward signal $e_{ff,k}(t)$ to obtain a kth frequency-domain position error signal $e_k(jw)$ and a kth frequency-domain feed-forward signal $e_{ff,k}(jw)$, specifically:

$$\begin{cases} e_k(jw) = F\{e_k(t)\} \\ e_{ff,k}(jw) = F\{e_{ff,k}(t)\} \end{cases}$$

where F represents the Fourier transform, j represents an imaginary unit, and w represents an angular frequency;

step 2, obtaining a (k+1)th frequency-domain feed-forward signal $e_{ff,k+1}(jw)$ from the kth frequency-domain position error signal $e_k(jw)$ and the kth frequency-domain feed-forward signal $e_{ff,k}(jw)$, specifically:

$$e_{ff,k+1}(jw) = e_{ff,k}(jw) + \alpha \overline{G}_{eso}^{-1}(jw)e_k(jw)$$

where $$\overline{G}_{eso}(jw) = \left. \frac{\overline{P}_{eso}(s)C_{fb}(s)}{1 + \overline{P}_{eso}(s)C_{fb}(s)} \right|_{s=jw},$$

$\overline{G}_{eso}^{-1}(jw)$ represents an inverse of $\overline{G}_{eso}(jw)$, $$\overline{P}_{eso}(s) = \frac{1}{s^2}, C_{fb}(s)$$

is a transfer function of the feedback controller $C_{fb}$, s represents a Laplace operator, and $\alpha \in (0\ 1)$ is a learning coefficient, which may be designed as a constant, and may also be designed adaptively;

step 3, performing inverse Fourier transform on the (k+1)th frequency-domain feed-forward signal $e_{ff,k+1}(jw)$ to obtain the (k+1)th feed-forward signal $e_{ff,k+1}(t)$, specifically:

$$e_{ff,k+1}(t) = F^{-1}\{e_{ff,k+1}(jw)\}$$

where $F^{-1}$ represents the inverse Fourier transform; and step 4, calculating, by the extended state observer $C_{eso}$, the uncertainty estimated signal $\hat{\mu}_{d,k}(t)$ according to the corrected control quantity $u_{mo,k}(t)$ and the position measured signal $y_{\varepsilon,k}(t)$ by:

$$\begin{cases} u_{mo,k}(s) = L\{u_{mo,k}(t)\} \\ y_{\varepsilon,k}(s) = L\{y_{\varepsilon,k}(t)\} \\ F\mu_{ud,k}(s) = \dfrac{-\dfrac{1}{\hat{m}}}{\left(\dfrac{s}{w_o}+1\right)^3}u_{mo,k}(s) + \dfrac{s^2}{\left(\dfrac{s}{w_o}+1\right)^3}y_{\varepsilon,k}(s) \\ F\mu_{ud,k}(t) = L^{-1}\{F\mu_{ud,k}(s)\} \end{cases}$$

where L represents Laplace transform, $L^{-1}$ represents inverse Laplace transform, and $w_0$ is a bandwidth of the extended state observer $C_{eso}$.

Compared with the prior art, the present disclosure has the following advantages:

The present disclosure is realized only with the approximate mass of the control object and without the accurate model of the control object. By introducing the extended state observer on the basis of conventional learning control, the present disclosure approximately corrects the control object as a two-order system with a unit mass. The present disclosure compensates the model uncertainty and suppresses the external random disturbance at the same time, improves the control accuracy, and has a strong engineering application value.

DETAILED DESCRIPTION OF THE EMBODIMENTS

The technical solutions of the present disclosure are further described below with reference to the drawings, but the present disclosure is not limited thereto. Any modification or equivalent replacement for the technical solutions of the present disclosure made without departing from the spirit and scope of the technical solutions of the present disclosure should fall within the protection scope of the present disclosure.

Figure 1:
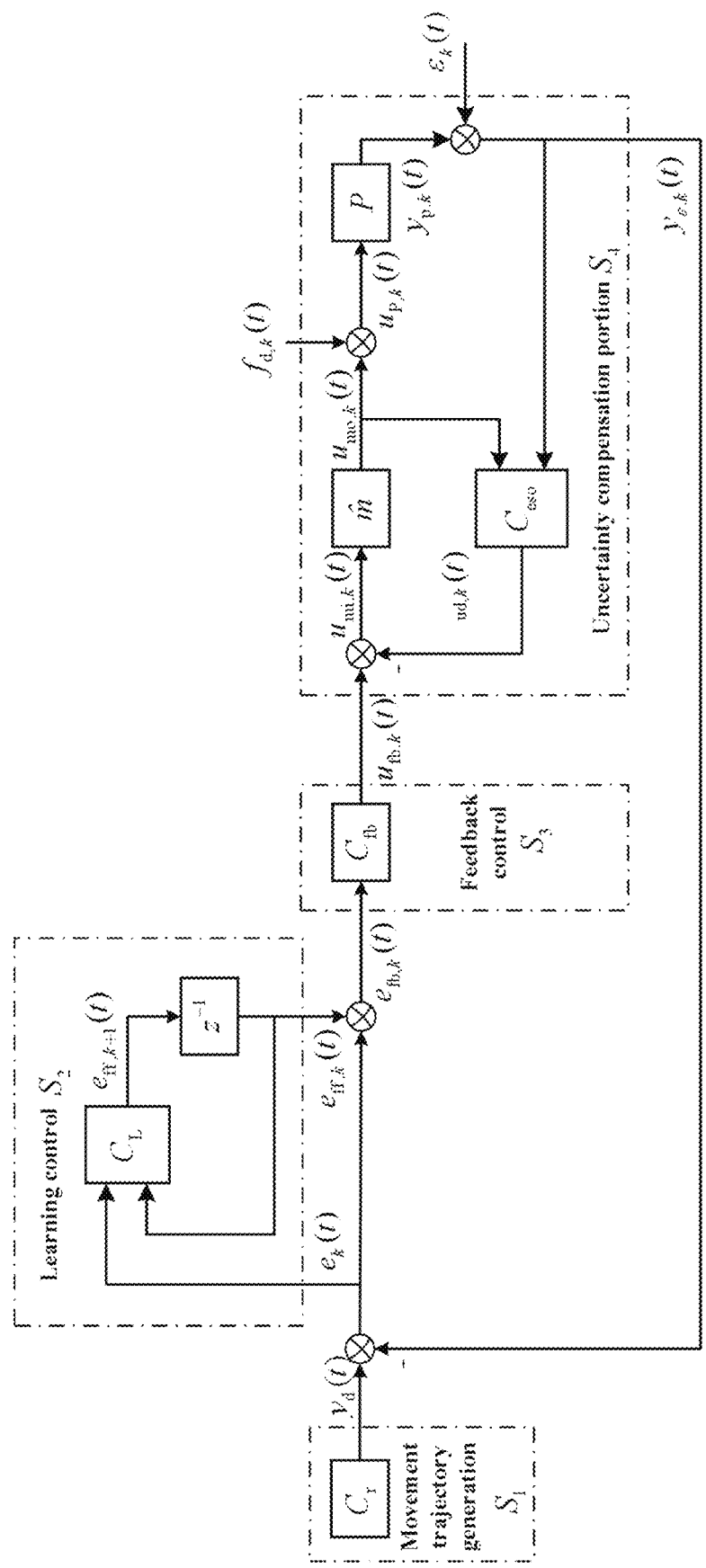
FIG. 1 is a topological diagram of a learning control system for an ultra-precision lithographic apparatus based on uncertainty compensation according to the present disclosure.

The present disclosure provides a learning control system for an ultra-precision lithographic apparatus based on uncertainty compensation. As shown in FIG. 1, the learning control system includes a movement trajectory generation unit $S_1$, a learning control unit $S_2$, a feedback control unit $S_3$, and an uncertainty compensation unit $S_4$.

The movement trajectory generation unit $S_1$ includes a movement trajectory generator $C_r$. The movement trajectory generator $C_r$ is configured to generate a reference movement trajectory $y_d(t)$. A position measured signal $y_{\varepsilon,k}(t)$ is subtracted from the reference movement trajectory $y_d(t)$ to obtain a position error signal $e_k(t)$. The position error signal $e_k(t)$ is input to the learning control unit $S_2$. The learning control unit $S_2$ is configured to generate a feed-forward signal $e_{ff,k}(t)$. The feed-forward signal $e_{ff,k}(t)$ and the position error signal $e_k(t)$ are added together to obtain a corrected error signal $e_{fb,k}(t)$. The corrected error signal $e_{fb,k}(t)$ is input to the feedback control unit $S_3$. The feedback control unit $S_3$ includes a feedback controller $C_{fb}$. The feedback controller $C_{fb}$ is configured to generate a feedback control quantity $u_{fb,k}(t)$. The feedback control quantity $u_{fb,k}(t)$ is input to the uncertainty compensation unit $S_4$. The uncertainty compensation unit $S_4$ is configured to generate the position measured signal $y_{\varepsilon,k}(t)$.

The learning control unit $S_2$ includes a learning controller $C_L$ and an iterative backward shift operator $z^{-1}$. The position error signal $e_k(t)$ and the feed-forward signal $e_{ff,k}(t)$ are input to the learning controller $C_L$. The learning controller $C_L$ is configured to generate a (k+1)th feed-forward signal $e_{ff,k+1}(t)$. The (k+1)th feed-forward signal $e_{ff,k+1}(t)$ is input to the iterative backward shift operator $z^{-1}$. The iterative backward shift operator $z^{-1}$ is configured to generate the kth feed-forward signal $e_{ff,k}(t)$.

The uncertainty compensation unit $S_4$ includes a nominal mass module $\hat{m}$, a lithographic apparatus P, an extended state observer $C_{eso}$, an external disturbance signal $f_{d,k}(t)$, and a measured noise signal $\varepsilon_k(t)$. An uncertainty estimated signal $\hat{\mu}_{d,k}(t)$ is subtracted from the feedback control quantity $u_{fb,k}(t)$ to obtain a compensated control quantity $u_{mi,k}(t)$. The compensated control quantity $u_{mi,k}(t)$ is input to the nominal mass module $\hat{m}$. The nominal mass module $\hat{m}$ is configured to generate a corrected control quantity $u_{mo,k}(t)$. The corrected control quantity $u_{mo,k}(t)$ and the external disturbance signal $f_{d,k}(t)$ are added together to obtain a total input signal $u_{P,k}(t)$. The total input signal $u_{P,k}(t)$ is input to the lithographic apparatus P. The lithographic apparatus P is configured to generate an actual position signal $y_{P,k}(t)$. The actual position signal $y_{P,k}(t)$ and the measured noise signal $\varepsilon_k(t)$ are added together to obtain a position measured signal $y_{\varepsilon,k}(t)$. The position measured signal $y_{\varepsilon,k}(t)$ and the corrected control quantity $u_{mo,k}(t)$ are input to the extended state observer $C_{eso}$. The extended state observer $C_{eso}$ is configured to generate the uncertainty estimated signal $F\mu_{d,k}(t)$.

The subscript k represents a number of iterative experiments, k ≥ 1, and t represents time.

The present disclosure provides a learning control method for an ultra-precision lithographic apparatus based on uncertainty compensation. According to the above system, the learning controller $C_L$ is configured to obtain the (k+1)th feed-forward signal $e_{ff,k+1}(t)$ according to the kth position error signal $e_k(t)$ and the kth feed-forward signal $e_{ff,k}(t)$. The control method includes the following steps:

In step 1, Fourier transform is performed on the kth position error signal $e_k(t)$ and the kth feed-forward signal $e_{ff,k}(t)$ to obtain a kth frequency-domain position error signal $e_k(jw)$ and a kth frequency-domain feed-forward signal $e_{ff,k}(jw)$, specifically:

$$\begin{cases} e_k(jw) = F\{e_k(t)\} \\ e_{ff,k}(jw) = F\{e_{ff,k}(t)\} \end{cases}$$

where F represents the Fourier transform, j represents an imaginary unit, and w represents an angular frequency.

In step 2, a (k+1)th frequency-domain feed-forward signal $e_{ff,k+1}(jw)$ is obtained from the kth frequency-domain position error signal $e_k(jw)$ and the kth frequency-domain feed-forward signal $e_{ff,k}(jw)$, specifically:

$$e_{ff,k+1}(jw) = e_{ff,k}(jw) + \alpha G_{eso}^{-1}(jw) e_k(jw)$$

where $$\overline{G}_{eso}(jw) = \left. \frac{\overline{P}_{eso}(s) C_{fb}(s)}{1 + \overline{P}_{eso}(s) C_{fb}(s)} \right|_{s=jw},$$

$G_{eso}^{-1}(jw)$ represents an inverse of $\overline{G}_{eso}(jw)$, $$\overline{P}_{eso}(s) = \frac{1}{s^2},$$

$C_{fb}(s)$ is a transfer function of the feedback controller $C_{fb}$, s represents a Laplace operator, and $\alpha \in (0\ 1)$ is a learning coefficient, which may be designed as a constant, and may also be designed adaptively.

In step 3, inverse Fourier transform is performed on the (k+1)th frequency-domain feed-forward signal $e_{ff,k+1}(jw)$ to obtain the (k+1)th feed-forward signal $e_{ff,k+1}(t)$, specifically:

$$e_{ff,k+1}(t) = F^{-1}\{e_{ff,k+1}(jw)\}$$

where $F^{-1}$ represents the inverse Fourier transform.

In step 4, the extended state observer $C_{eso}$ calculates the uncertainty estimated signal $F\mu_{d,k}(t)$ according to the corrected control quantity $u_{mo,k}(t)$ and the position measured signal $y_{\varepsilon,k}(t)$ by:

$$\begin{cases} u_{mo,k}(s) = L\{u_{mo,k}(t)\} \\ y_{\varepsilon,k}(s) = L\{y_{\varepsilon,k}(t)\} \\ F\mu_{ud,k}(s) = \dfrac{-\dfrac{1}{\hat{m}}}{\left(\dfrac{s}{w_o}+1\right)^3} u_{mo,k}(s) + \dfrac{s^2}{\left(\dfrac{s}{w_o}+1\right)^3} y_{\varepsilon,k}(s) \\ F\mu_{ud,k}(t) = L^{-1}\{F\mu_{ud,k}(s)\} \end{cases}$$

where L represents Laplace transform, $L^{-1}$ represents inverse Laplace transform, and $w_0$ is a bandwidth of the extended state observer $C_{eso}$.

EXAMPLE

Figure 2:
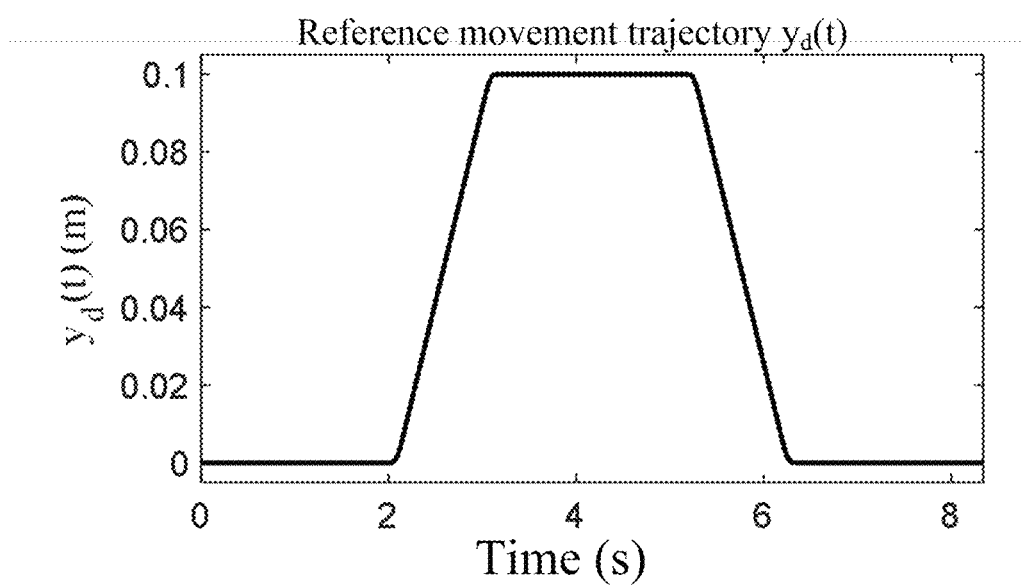
FIG. 2 illustrates a reference movement trajectory according to an embodiment.

In the example, the movement trajectory generator $C_r$ is a five-order S-shaped movement trajectory generator, and the generated reference movement trajectory $y_d(t)$ is as shown in FIG. 2. The transfer function $C_{fb}(s)$ of the feedback controller $C_{fb}$, and the transfer function $P(s)$ of the lithographic apparatus P are set forth hereinafter respectively:

$$C_{fb}(s) = \frac{7.549s^2 + 1413s + 5.173 \times 10^4}{0.000019s^2 + 0.02002s},$$

$$P(s) = \frac{1}{12s^2} + \frac{0.013}{s^2 + 100.53s + (2\pi \times 200)^2} + \frac{0.0023}{s^2 + 133.91s + (2\pi \times 592)^2}.$$

The nominal mass module $\hat{m}$ is $\hat{m} = 11$, and the learning coefficient $\alpha$ in the learning controller $C_L$ is $\alpha = 0.7$. The measured noise signal $\varepsilon_k(t)$ is a white noise signal with a variance of $0.1 \times 10^{-9}$ and a mean of 0. The disturbance signal $f_{d,k}(t)$ is a white noise signal with a variance of 1 and a mean of 0. The bandwidth $w_0$ of the extended state observer $C_{eso}$ is $w_0 = 2\pi \times 600$.

Figure 3:
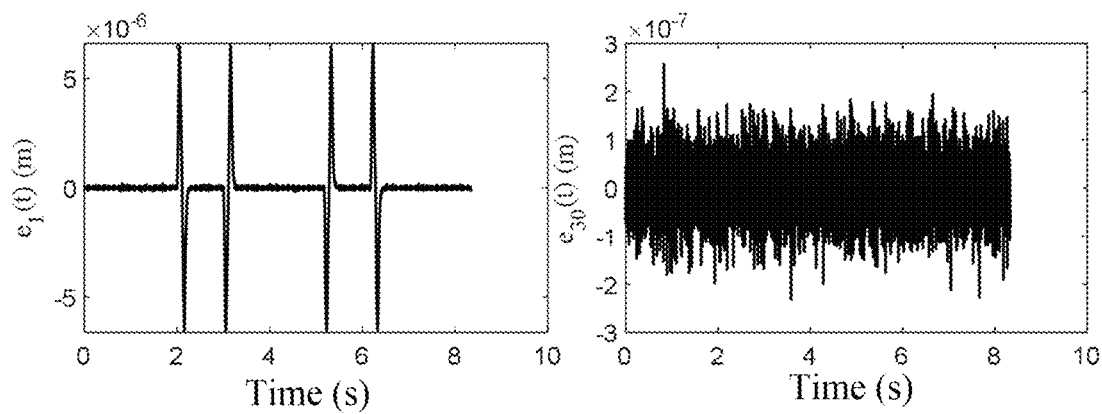
FIG. 3 illustrates an effect of a method according to an embodiment of the present disclosure.

Thirty iterative experiments are made according to the steps in the specific implementation, with simulation results as shown in FIG. 3. It can be observed that through multiple iterations, the learning control system and method for an ultra-precision lithographic apparatus based on uncertainty compensation provided by the present disclosure can greatly reduce the position error.

Figure 4:
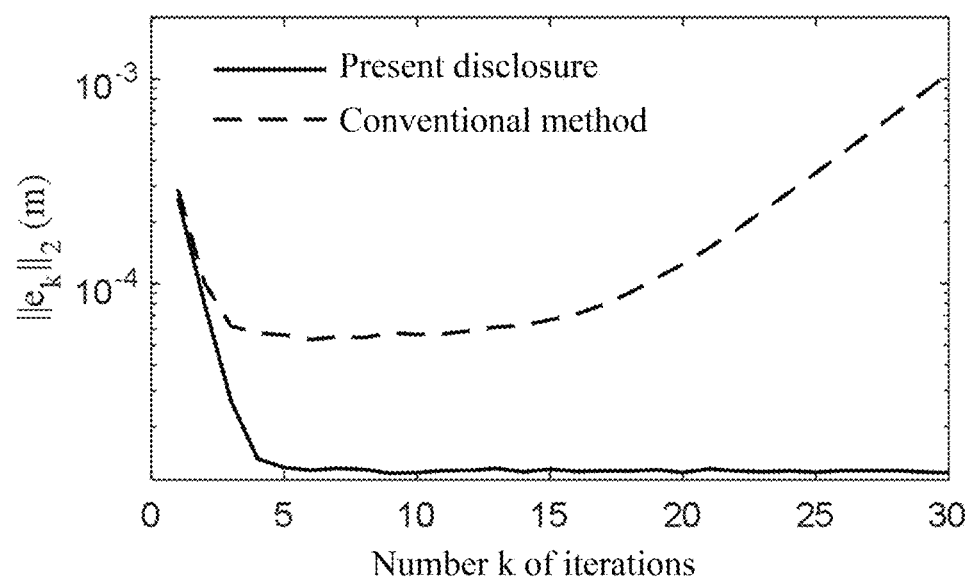
FIG. 4 illustrates comparison between a method of the present disclosure and an existing method based on an inaccurate model according to an embodiment.

In order to describe an effect of comparison between the method of the present disclosure and the existing iterative learning control method based on an inverse model, FIG. 4 gives comparison between the method of the present disclosure and the existing method when the model in the existing method is inaccurate (same model information as the present disclosure is used, namely only the nominal mass $\hat{m} = 11$ of the lithographic apparatus P is used, and the lithographic apparatus P has an estimation model of $$P_m(s) = \frac{1}{11s^2}\bigg).$$

It can be observed that after several iterations, the existing method exhibits a divergence phenomenon. This is largely due to the fact that the estimation model $P_m(s)$ is greatly different from the actual model P(s) to violate related conditions for convergence of the iterative learning, and the corresponding position error signal at the resonance frequency is accumulated gradually. The extended state observer $C_{eso}$ introduced in the method of the present disclosure is used to correct the control object as a double integration process with a unit mass. This greatly compensates the model uncertainty, and ensures the convergence of the learning controller $C_L$.

Figure 5:
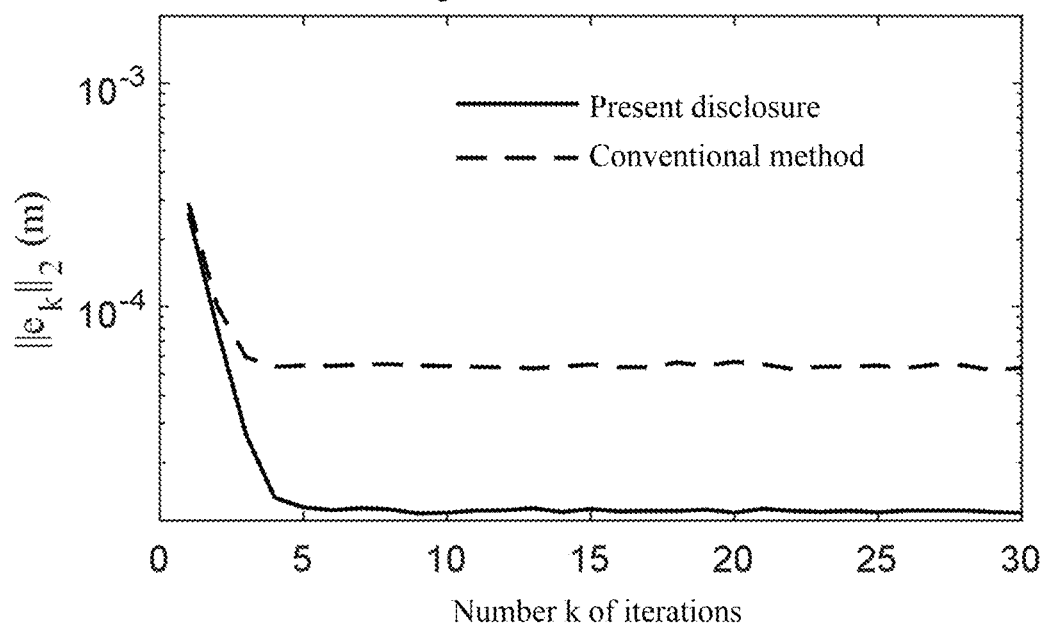
FIG. 5 illustrates comparison between a method of the present disclosure and an existing method based on an accurate model according to an embodiment.

FIG. 5 gives comparison between the existing method based on an accurate model (the lithographic apparatus P has an estimation model of $P_m(s)=P(s)$) and the method of the present disclosure. After the accurate model is used, the existing method realizes convergence without the divergence phenomenon, but still has a large error after the convergence as compared with the method of the present disclosure. The existing method cannot suppress the random disturbance. However, the extended state observer $C_{eso}$ in the method of the present disclosure not only can compensate the model uncertainty, but also can suppress the random disturbance in the bandwidth of $w_0$ to some extent to achieve more excellent control performance.

As can be seen from FIG. 3 to FIG. 5, the learning control system and method for an ultra-precision lithographic apparatus based on uncertainty compensation provided by the present disclosure compensate the model uncertainty and suppress the random disturbance at the same time with less model information (the lithographic apparatus P has the nominal mass of $\hat{M}$), and achieve higher control accuracy.

What is claimed is:

1. A learning control system for an ultra-precision lithographic apparatus based on uncertainty compensation, comprising a movement trajectory generation unit($S_1$), a learning control unit ($S_2$), a feedback control unit ($S_3$), and an uncertainty compensation unit ($S_4$), wherein the movement trajectory generation unit ($S_1$) comprises a movement trajectory generator ($C_r$); the movement trajectory generator $C_r$ is configured to generate a reference movement trajectory ($y_d(t)$); a position measured signal ($y_{\varepsilon,k}(t)$) is subtracted from the reference movement trajectory ($y_d(t)$) to obtain a position error signal ($e_k(t)$); and the position error signal ($e_k(t)$) is input to the learning control unit ($S_2$);

the learning control unit $S_2$ comprises a learning controller ($C_L$) and an iterative backward shift operator ($z^{-1}$); the position error signal ($e_k(t)$) and a kth feed-forward signal ($e_{ff,k}(t)$) are input to the learning controller ($C_L$); the learning controller ($C_L$) is configured to generate a (k+1)th feed-forward signal ($e_{ff,k+1}(t)$); the (k+1)th feed-forward signal ($e_{ff,k+1}(t)$) is input to the iterative backward shift operator ($z^{-1}$); the iterative backward shift operator ($z^{-1}$) is configured to generate the kth feed-forward signal ($e_{ff,k}(t)$); the kth feed-forward signal ($e_{ff,k}(t)$) and the position error signal ($e_k(t)$) are added together to obtain a corrected error signal ($e_{fb,k}(t)$); and the corrected error signal ($e_{fb,k}(t)$) is input to the feedback control unit ($S_3$);

the feedback control unit ($S_3$) comprises a feedback controller ($C_{fb}$); the feedback controller ($C_{fb}$) is configured to generate a feedback control quantity ($u_{fb,k}(t)$); and the feedback control quantity ($u_{fb,k}(t)$) is input to the uncertainty compensation unit ($S_4$);

the uncertainty compensation unit ($S_4$) comprises a nominal mass module ($\hat{M}$), a lithographic apparatus (P), an extended state observer ($C_{eso}$), an external disturbance signal ($f_{d,k}(t)$), and a measured noise signal ($\varepsilon_k(t)$); an uncertainty estimated signal ($\hat{F}^{-1}_{d,k}(t)$) is subtracted from the feedback control quantity ($u_{fb,k}(t)$) to obtain a compensated control quantity ($u_{mi,k}(t)$); the compensated control quantity ($u_{mi,k}(t)$) is input to the nominal mass module $\hat{M}$;; the nominal mass module ($\hat{M}$) is configured to generate a corrected control quantity ($u_{mo,k}(t)$); the corrected control quantity ($u_{mo,k}(t)$) and the external disturbance signal $f_{d,k}(t)$ are added together to obtain a total input signal ($u_{P,k}(t)$); the total input signal $u_{P,k}(t)$ is input to the lithographic apparatus (P); the lithographic apparatus P is configured to generate an actual position signal ($y_{P,k}(t)$); the actual position signal ($y_{P,k}(t)$) and the measured noise signal ($\varepsilon_k(t)$) are added together to obtain the position measured signal ($y_{\varepsilon,k}(t)$); the position measured signal ($y_{\varepsilon,k}(t)$) and the corrected control quantity ($u_{mo,k}(t)$) are input to the extended state observer ($C_{eso}$); and the extended state observer ($C_{eso}$) is configured to generate the uncertainty estimated signal ($\hat{F}^{-1}_{d,k}(t)$); and subscript k represents a number of iterative experiments, $k \geq 1$, and t represents time.

2. A learning control method for an ultra-precision lithographic apparatus based on uncertainty compensation with the system according to claim 1, comprising the following steps:

step 1, performing Fourier transform on the kth position error signal ($e_k(t)$) and the kth feed-forward signal ($e_{ff,k}(t)$) to obtain a kth frequency-domain position error signal ($e_k(jw)$) and a kth frequency-domain feed-forward signal ($e_{ff,k}(jw)$), specifically:

$$\begin{cases} e_k(jw) = F\{e_k(t)\} \\ e_{ff,k}(jw) = F\{e_{ff,k}(t)\} \end{cases}$$

wherein F represents the Fourier transform, j represents an imaginary unit, and w represents an angular frequency;

step 2, obtaining a (k+1)th frequency-domain feed-forward signal ($e_{ff,k+1}(jw)$) according to the kth frequency-domain position error signal ($e_k(jw)$) and the kth frequency-domain feed-forward signal ($e_{ff,k}(jw)$), specifically:

$$e_{ff,k+1}(jw) = e_{ff,k}(jw) + \alpha \overline{G}_{eso}^{-1}(jw) e_k(jw)$$

wherein $$\overline{G}_{eso}(jw) = \left.\frac{\overline{P}_{eso}(s) C_{fb}(s)}{1 + \overline{P}_{eso}(s) C_{fb}(s)}\right|_{s=jw},$$

$\overline{G}_{eso}^{-1}(jw)$ represents an inverse of $\overline{G}_{eso}(jw)$, $$\overline{P}_{eso}(s) = \frac{1}{s^2},$$

$C_{fb}(s)$ is a transfer function of the feedback controller ($C_{fb}$), s represents a Laplace operator, and $\alpha \in (0\ 1)$ is a learning coefficient;

step 3, performing inverse Fourier transform on the (k+1)th frequency-domain feed-forward signal ($e_{ff,k+1}(jw)$) to obtain the (k+1)th feed-forward signal ($e_{ff,k+1}(t)$), specifically:

$$e_{ff,k+1}(t) = F^{-1}\{e_{ff,k+1}(jw)\}$$

wherein $F^{-1}$ represents the inverse Fourier transform; and step 4, calculating, by the extended state observer ($C_{eso}$), the uncertainty estimated signal ($\hat{F}^{-1}_{d,k}(t)$) according to the corrected control quantity ($u_{mo,k}(t)$) and the position measured signal ($y_{\varepsilon,k}(t)$) by:

$$\begin{cases} u_{mo,k}(s) = L\{u_{mo,k}(t)\} \\ y_{\varepsilon,k}(s) = L\{y_{\varepsilon,k}(t)\} \\ F\mu_{ud,k}(s) = \dfrac{-\dfrac{1}{\hat{m}}}{\left(\dfrac{s}{w_o}+1\right)^3} u_{mo,k}(s) + \dfrac{s^2}{\left(\dfrac{s}{w_o}+1\right)^3} y_{\varepsilon,k}(s) \\ F\mu_{ud,k}(t) = L^{-1}\{F\mu_{ud,k}(s)\} \end{cases}$$

wherein L represents Laplace transform, $L^{-1}$ represents inverse Laplace transform, and $w_0$ is a bandwidth of the extended state observer ($C_{eso}$).

* * * * *